United States Patent [19]
Leary et al.

[11] Patent Number: 5,880,542
[45] Date of Patent: Mar. 9, 1999

[54] LIGHT REACTION MASS ACTUATOR

[75] Inventors: Kevin J. Leary, Hamilton; Shankar Jagannathan, Woburn, both of Mass.; Ralph C. Fenn, Ann Arbor, Mich.

[73] Assignee: SatCon Technology Corporation, Cambridge, Mass.

[21] Appl. No.: 866,567

[22] Filed: May 30, 1997

[51] Int. Cl.[6] .................................................. H01L 41/12
[52] U.S. Cl. ............................................................ 310/26
[58] Field of Search ................................ 310/15, 17, 26, 310/51; 318/118, 114

[56] References Cited

U.S. PATENT DOCUMENTS

| 5,184,037 | 2/1993 | Kobayashi et al. | 310/26 |
| 5,231,887 | 8/1993 | Arvidsson et al. | 74/88 |
| 5,406,153 | 4/1995 | Flateau et al. | 310/26 |

OTHER PUBLICATIONS

R. Fenn, et al., *Low Mass, high Reliability Magnetostrictive Reaction Mass Actuators,* SatCon Technology, Active Control of Vibration and Noise Symposium ASME Winter Annual Meeting, Nov. 6–11, 1994, pp. 1–9.

*Primary Examiner*—Nestor Ramirez
*Assistant Examiner*—Judson H. Jones
*Attorney, Agent, or Firm*—David G. Conlin; George W. Neuner; Dike, Bronstein, Roberts & Cushman, LLP

[57] ABSTRACT

A very light, high force reaction-mass actuator using high energy density magnetostrictive material to accelerate a mass, producing a reaction force that can be used to oppose vibration forces. The reaction-mass actuator is configured having an axially symmetric design that features a Terfenol-D rod as a core. Surrounding the rod is a magnetic coil which provides the changing magnetizing field used to actively control magnetostrictive strain of the Terfenol rod. The magnetic coil also provides a magnetic flux based on a D.C. current, for biasing the Terfenol rod. The magnetic coil, disposed about the fixed magnetostrictive rod, is incorporated into a reaction mass assembly that is suspended and sealed inside an enclosed, stiff outer shell or housing by an elastomeric material mounting configuration that facilitates an output force with suppressed harmonic content. In addition, the elastomeric mounting configuration provides sealing protection against external factors. In one embodiment, the magnetic coil is wound on a bobbin effecting a movable mass that is accelerated to produce a force on a mounting surface. The Terfenol rod is placed under axially compressive stress by a simple mechanical preloading mechanism. This increases strain in the Terfenol rod while providing a return spring for the reaction mass when it has reached its maximum stroke.

19 Claims, 3 Drawing Sheets

LIGHT REACTION MASS ACTUATOR

This invention was made with Government support under contract(s): DAAJ02-93-C-0005; and DAAJ02-95-0026. The Government has certain rights in the invention.

FIELD OF THE INVENTION

The present invention relates to noise and vibration damping, and more particularly to damping structural vibration with high force-to-mass ratio actuators.

BACKGROUND OF THE INVENTION

Mechanical or structural vibration in mechanical systems typically can result in auditory noise. The structural vibration, such as from a large surface set in vibratory motion, substantially simultaneously sets into motion the acoustic medium, e.g. air or water, around the vibrating member. Thus, when a structure in a mechanical system is set into motion by a mechanical source of vibration, it in turn causes a propagation of an acoustical signal, i.e. noise, in the surrounding air. Furthermore, vibration generated in one place in a mechanical system is often transmitted elsewhere through transmitting structures in the mechanical system, and is undesirably further converted into audible or airborne noise by radiating structures. Accordingly, noise levels in mechanical systems, such as large helicopters, can be very high in part due to vibrations originating as structural noise, e.g. in meshing gears in the transmission. The low mass of mechanical systems, such as helicopter transmissions, accentuates the problem of structural vibration and noise. Resultant noise can have problematic implications in other systems in the aircraft, including communication systems. Typical vibration frequencies of helicopter transmissions and other aircraft equipment in the 1 to 2 kHz range can cause significant interference with the audibility of speech, which has many frequency components in that range.

Past efforts to reduce structural vibration and/or noise in helicopter transmissions have focused on passive techniques such as: transmission tuning to shift the frequency of vibrations to an innocuous range; isolation to limit and/or preclude resonances caused by the interplay of vibration from different sources; and absorption to muffle or absorb noise by way of noise barriers. However, these approaches do not produce sufficient reductions in vibration and noise.

Active feedback methods are being investigated and applied as a promising alternative approach to reducing narrow-band vibration and noise in environments where passive techniques have proven inadequate (e.g. at higher frequencies, for example, greater than 400 Hz). Typical active feedback methods require transducers or sensors to sense noise levels at frequencies of interest and actuators to deliver cancellation signals at corresponding frequencies, typically 180 degrees out of phase with the noise sensed. However, a lack of availability of high force-to-mass ratio actuators significantly limits the applicability of such active vibration cancellation schemes in weight sensitive applications, such as helicopters or other aircraft. That is, the availability of light weight actuators that can deliver the high forces necessary for high frequency active noise cancellation is very limited. In particular, of the components required in active noise cancellation systems (e.g. sensors, actuators, controllers and electronics), it is the mass of the actuator(s) that is the critical consideration, for example in helicopter applications.

Reaction Mass Actuators (RMAs) are known for delivering forces for active noise cancellation. RMAs are typically designed and configured to be mounted on vibrating structures to deliver cancellation signals on the structures, and to substantially preclude the transmission of vibration through the structures. Electromagnetic voice coil RMAs are known which typically use springs and masses to produce a resonant system that achieves relatively high force densities. However, the resonant system in electromagnetic voice coil RMAs produces high force in a narrow band of frequencies, and almost no force at non-resonant frequencies. Accordingly, electromagnetic RMAs have a very narrow band of useful frequencies, i.e. they are of limited applicability in applications where a broader range of frequencies is involved. Further, the resonant systems in some known electromagnetic voice coil RMAs include solid components that engage each other causing "chatter" and/or harmonic noise at frequencies other than that of the output force. Extraneous noise generated by known voice coil RMAs works counter to the purpose for which the devices are generally employed. Additionally, disadvantageously, many known electromagnetic voice coil RMAs are open designs with actuators that are not readily or easily sealed from the elements.

Some known RMAs incorporate piezoelectric or electrostrictive materials to effect actuation. However, such known RMAs have disadvantages in certain applications. Specifically, high voltages on the order of 1,000 volts are typically required for piezoelectric or electrostrictive actuators, presenting numerous issues associated with power sourcing. The power sourcing requirements mitigate against the use of such actuators in weight sensitive applications.

Magnetostrictive materials have properties similar to piezoelectric and electrostrictive materials and have been used in active actuator applications. The magnetostrictive materials used change shape (strain) in the presence of magnetic fields by up to 2000 $\mu$-strain (ppm) at room temperatures, which is twice the strain available in the best piezoelectric or electrostrictive materials. With magnetostrictive materials, achieving such large strains does not require the use of high voltages.

Another advantage of magnetostrictive materials in actuator applications, over competing technologies such as piezoelectric, is a lack of fatigue phenomena. There is no known fatigue mechanism in known magnetostrictive materials and therefore no time or cycle dependant lifetime. This is in contrast with piezoelectric materials, which suffer from microfractures that develop during use and lead to breakdown under the high voltages required for implementation of piezoelectric actuators.

Terfenol-D® magnetostrictive material, produced by ETREMA Products Inc., a Subsidiary of EDGE Technologies Incorporated, is a room temperature, high performance magnetostrictive material which increases in length when a magnetizing field is applied parallel to the material's drive axis. Magnetostrictive strain depends only on the magnitude of the magnetizing field, not its sign. Bi-directional actuation can be achieved by inclusion of a bias field such as produced by a coil or permanent magnets, to bias the Terfenol-D material to elongation of some degree, e.g. one half, of its linear range enabling actuation about a bias point. Some sort of mechanical prestress is generally desirable, as it has been determined that the best performance of Terfenol-D is achieved by configuring the magnetostrictive material with mechanical prestress or compressive preload.

Terfenol, however, is relatively weak in tension and is known to be brittle. These properties can affect actuator reliability in improperly designed devices incorporating such material. For practical application, magnetostrictive actuators typically require sophisticated mechanical designs to ensure longevity of the actuator. Elaborate mechanical features designed into known magnetostrictive actuators to isolate the Terfenol rod from shear and tensile stresses, and to overcome weaknesses due to the physical properties of Terfenol, add significant cost and weight to the actuators. Generally, known magnetostrictive actuators have limitations and present significant design issues when subjected to significant loads.

Furthermore, known Terfenol actuators have limited applicability in RMA applications. The mechanical design of known Terfenol actuators is such that they tend to be high friction devices with a significant amount of static friction (stiction), and damping in the actuator. In addition, they have a low moving mass, high actuator mass, and low power density that makes them unusable in most reaction mass applications.

Terfenol magnetostrictive material has been used in actuators other than RMAs, such as actuators described in U.S. Pat. Nos. 5,231,887 and 5,406,153. The mechanical configurations described therein, like other known magnetostrictive actuators, are not suitable for RMA applications in that they are high friction devices with a significant amount of static friction (stiction), and damping in the actuator. The designs, which are clearly not intended for RMA applications, include several solid components that will interact with each other to generate harmonic noise at frequencies other than that of the output force. Furthermore, in these illustrative implementations of magnetostrictive actuators, there is no concern for maximizing the mass of the actuator for the purpose of power density maximization.

SUMMARY OF THE INVENTION

The present invention provides a very light, high force reaction-mass actuator using high energy density magnetostrictive material in a sealed substantially noise or harmonic free configuration, to accelerate a mass producing a reaction force that can be used to oppose vibration forces.

According to the invention, the reaction-mass actuator is configured having an axially symmetric design that features a magnetostrictive rod as a core. Surrounding the rod is a magnetic coil which provides the changing magnetizing field used to actively control magnetostrictive strain of the Terfenol rod. The magnetic coil also provides a magnetic flux based on a D.C. current, for biasing the Terfenol rod. The magnetic coil, disposed about the fixed magnetostrictive rod, is incorporated into a reaction mass assembly that is suspended and sealed inside an enclosed housing by an elastomeric material mounting configuration that provides an output force with suppressed harmonic content.

In one embodiment of the invention, the magnetic coil is wound on a bobbin effecting a movable coil reaction mass that is accelerated to produce the output force. The magnetostrictive rod is disposed interior to the bobbin and placed under axially compressive stress by a simple mechanical preloading mechanism. This increases strain in the rod while providing a return spring for the reaction mass when it has reached its maximum stroke. The movable mass is suspended in a stiff outer shell by a plurality of O-rings that provide support for the moving mass and sealing protection against external factors, such as weather, and external shocks and loads. The magnetostrictive rod, which expands when it is exposed to the magnetic field provided by the coil, is used to accelerate the movable mass including the coil, producing a reaction force that is used to oppose vibration forces.

Features of the invention include provision of a light weight, high force actuator suitable for a wide variety of vibration cancellation applications. A low parts count and simplicity of design result in a low cost actuator that has high reliability, high durability, and produces an output force with suppressed harmonic content. The light weight actuator is particularly well suited for application to vibration reduction of helicopter transmissions. An uncomplicated design yields a highly scalable device that can be produced in a wide range of force and frequency characteristics. Low actuator mass is facilitated by very large magnetostrictive strains, while a significant portion of the overall mass of the actuator is non-stationary, movable mass. Actuation is effected at a low operating voltage. High reliability is achieved through elimination of friction, wear, flexures, and fatigue phenomena. Additionally, actuators according to the invention are relatively low volume, high bandwidth, and mechanically simple relative to competing piezoelectric and electrostrictive devices.

BRIEF DESCRIPTION OF THE DRAWING

The foregoing and other features and advantages of the present invention will be more fully understood from the following detailed description of illustrative embodiments, taken in conjunction with the accompanying drawing in which.

DETAILED DESCRIPTION

Reaction Mass Actuators ("RMA") provide force through the acceleration of a (reaction) mass. RMAs require only one-point mounting, and do not require modification for multi-degree-of-freedom systems (although multiple single axis actuators are required for multi-degree-of-freedom applications). While voice coils and piezoelectric materials have been used for RMA applications, use of "giant" magnetostrictive materials such as Terfenol-D, with strains near 2000 parts-per-million provides several benefits, including high specific power and near infinite fatigue life.

Terfenol-D is excited by the application of a magnetic field in the desired direction of motion. Like voice coil actuators, a magnetic circuit is required to create magnetic flux in an appropriate location. Force is produced in the voice coil actuator through interaction of airgap flux with current carrying conductors or permanent magnets. In a magnetostrictively based RMA according to the invention, force is produced by magnetostrictive effect. Since the force produced is required to strain the magnetostrictive alloy as well as to do usable external work, use of the stored (strain) energy enables a much greater (reaction) force to be achieved.

Figure 1:
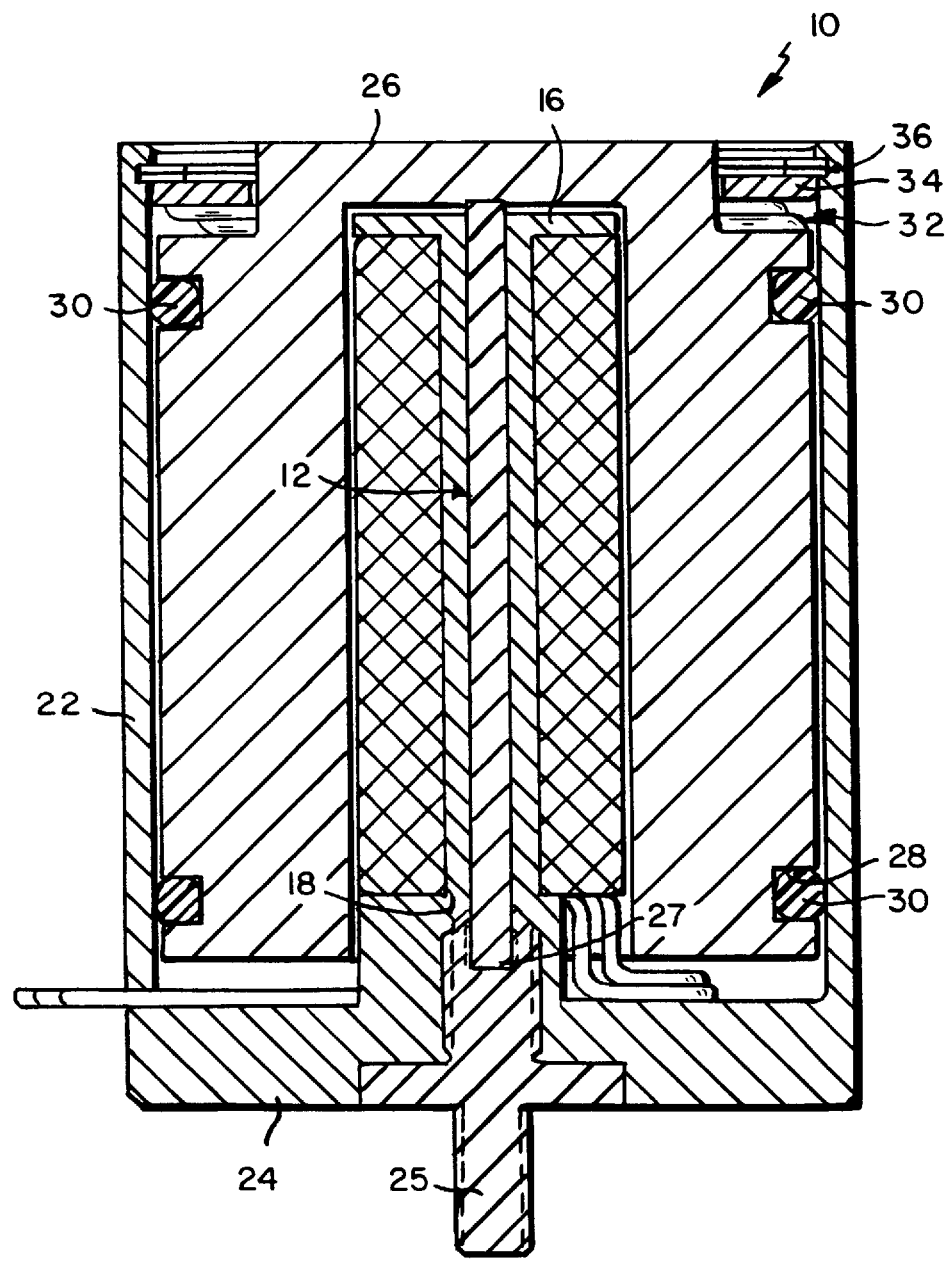
FIG. 1 is a side sectioned view of a Reaction Mass Actuator according to a first embodiment of the invention.

A high force to volume/mass ratio magnetostrictive reaction mass actuator according to the invention is illustrated in FIG. 1. The actuator operates as a resonant device allowing the stored strain energy to be utilized. The reaction-mass actuator 10 is configured having an uncomplicated axially symmetric design that features a Terfenol-D rod 12 as a core. A magnetic coil 14 is substantially symmetrically disposed on a non-magnetic bobbin 16, formed of, for example, aluminum, plastic or non-magnetic stainless steel. The bobbin 16 has a hollow cylindrical portion 18 in which the Terfenol rod 12 is installed.

A reaction mass 20 has an interior cavity in which a stationary drive assembly comprising the rod 12, bobbin 16 and coil 14 is disposed. The reaction mass 20 is formed of a solid piece of 303 stainless steel. In this illustrative embodiment, the mass 20 comprises approximately sixty percent of the total mass of the actuator effecting the actuator force and facilitating a high force to mass actuator according to the invention.

A rigid housing 22 includes a baseplate portion 24 against which a portion of the bobbin 16 abuts in the assembled actuator. The baseplate portion 24 includes an aperture for receiving a mounting lug 25 that includes a recess 27 dimensioned to receive an end portion of the magnetostrictive rod 12. The mounting lug 25 facilitates single point mounting of the RMA.

The reaction mass 20 is configured to be suspended in the rigid enclosed housing 22 with only a contact portion 26 of the mass 20 exposed to the exterior of the actuator. In this illustrative embodiment two suspension grooves 28 are formed in the mass 20 and are dimensioned to receive respective elastomeric suspension members 30. In this implementation the elastomeric suspension members 30 comprise O-rings that fit within the grooves 28 but are dimensioned to have a portion extending out of the groove to engage inner surfaces of the housing 22 to suspend the mass therein. The O-rings are effective to provide sealing protection against external factors, such as weather, and external shocks and loads.

A simple precompression mechanism, in the form of a wave spring 32 is located at a portion of the actuator 10 distal to the mounting lug 25. The wave spring 32 contacts portions of the reaction mass 20 and portions of a washer 34 that is held in place by a retaining ring 36. An interior portion of the reaction mass 20 engages an end of the Terfenol rod 12 so that the force exerted by the wave spring on the mass 20 is in turn exerted on the rod 12 effecting prestress thereof. The wave spring 32 is selected to provide sufficient prestress on the rod, as known in the art.

Figure 2A:
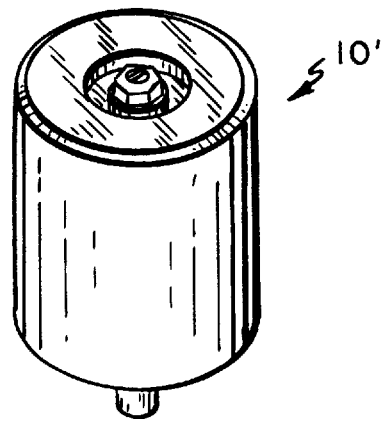
FIG. 2A is an assembled, perspective view of a reaction mass actuator according to the invention.
Figure 2B:
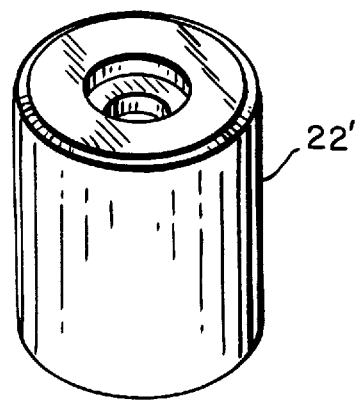
FIG. 2B is an exploded view of a moving coil reaction mass actuator according to the invention.
Figure 2B:
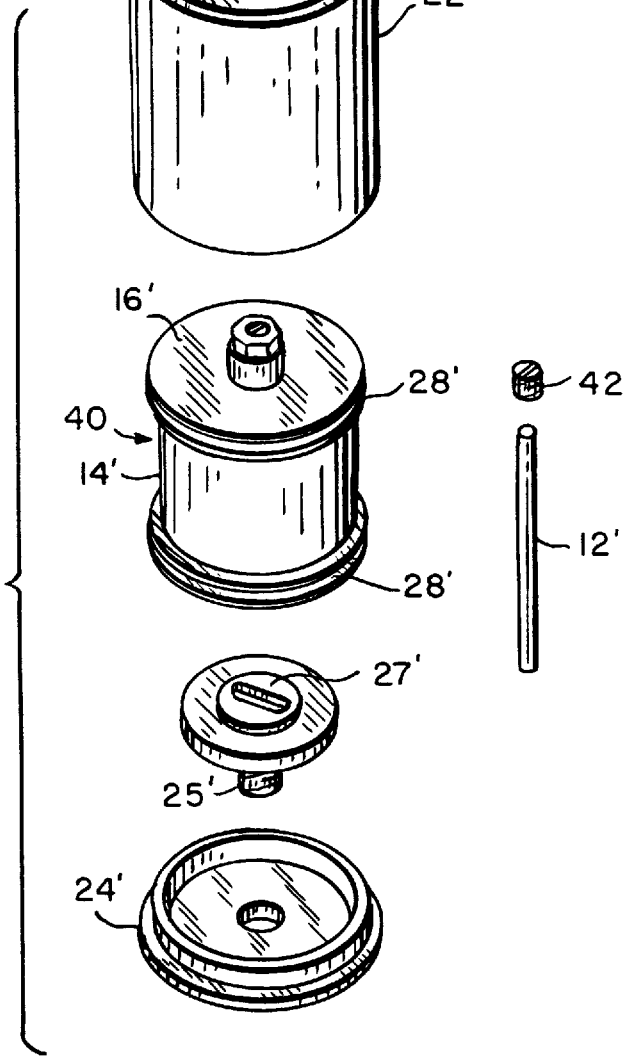
Figure 3:
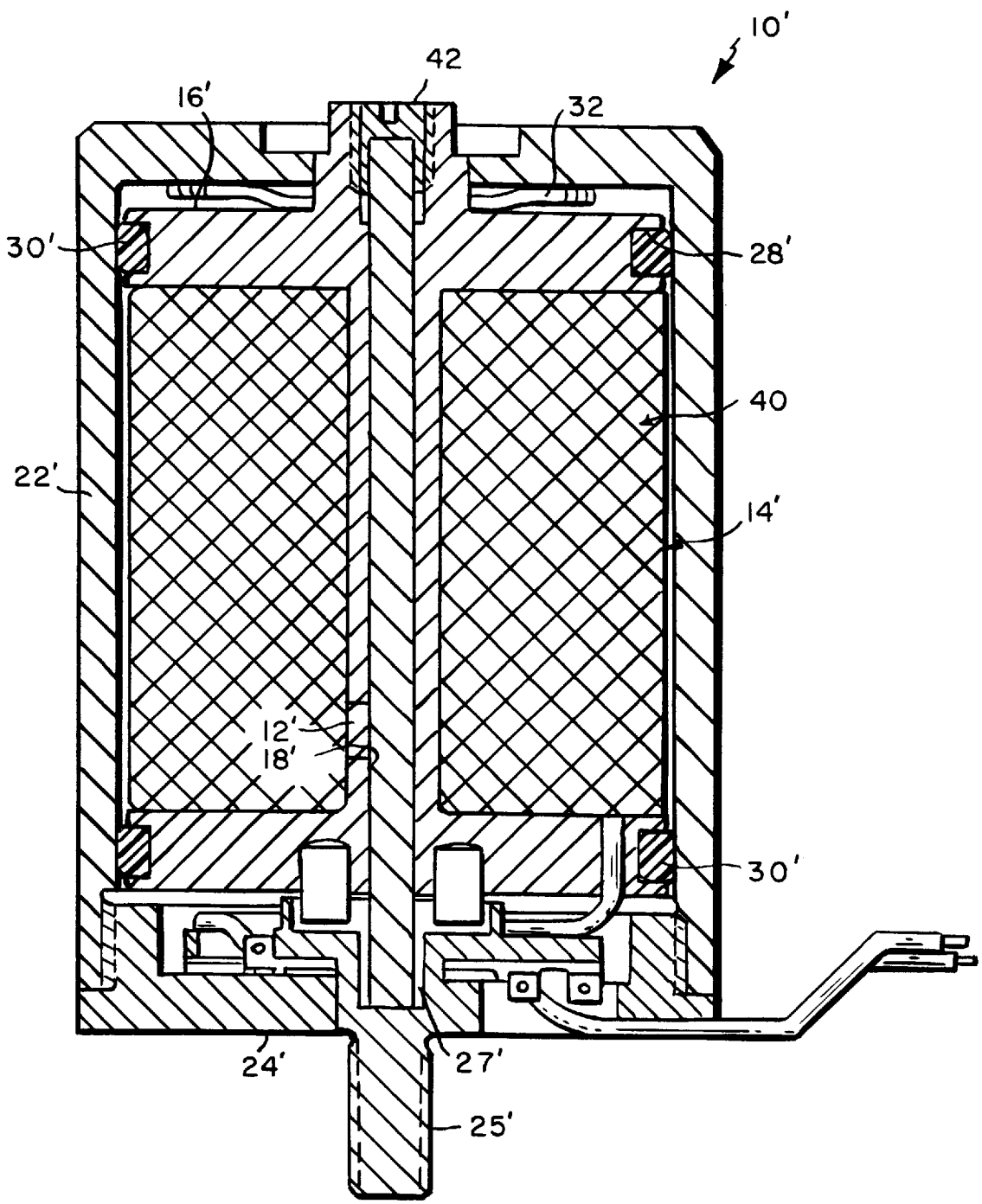
FIG. 3 is a side sectioned view of the reaction mass actuator of FIG. 2B.

Another embodiment of a high force to volume/mass ratio magnetostrictive reaction mass actuator according to the invention is illustrated in FIGS. 2A, 2B and 3. The actuator is substantially similar in form and function to the actuator described hereinbefore with respect to FIG. 1. The reaction-mass actuator 10' is configured, and best illustrated in FIG. 2B and FIG. 3, having an axially symmetric design that similarly features a Terfenol-D rod 12' as a core.

The reaction mass in this embodiment is constituted by a mass assembly 40 comprised of a magnetic coil 14' disposed on a non-magnetic bobbin 16'. The bobbin 16' has a hollow cylindrical portion 18' about which the coil 14' is substantially symmetrically wound. The magnetic coil 14' and bobbin 16' provide the movable mass that is accelerated to produce a force on a mounting surface in order to effect active vibration cancellation as known in the art. The mass assembly 40 in this illustrative embodiment comprises approximately eighty percent of the total mass of the actuator effecting the actuator force and facilitating a high force to mass actuator according to the invention.

As with the embodiment described hereinbefore, the magnetic coil 14' provides a changing magnetizing field, as known in the art, used to actively control magnetostrictive strain of the Terfenol rod 12'. In the present illustrative embodiment(s) of a reaction mass actuator, the changing magnetic field is in accordance with a mass excitation signal provided to the coil(s) 14, 14'. The magnetic coil(s) 14, 14' also provide magnetic flux for biasing the Terfenol rod, based on a D.C. biasing current combined with the mass excitation signal. Electronic circuitry (not shown), is configured as known in the art to provide both the mass excitation signal and the D.C. biasing current to the coil.

Single point mounting of the actuator 10' is, again, effected by a mounting lug 25' disposed through a baseplate 24' which is configured to accommodate lead wires and electrical contacts for interconnecting the magnetic coil 14' to the electronic circuitry. The mounting lug 25' includes a recess 27' dimensioned to receive an end of the terfenol rod 12'. The rod 12' is configured to be disposed in the recess 27' of the mounting lug 25', with the bobbin installed thereover so that the rod is contained in the hollow cylindrical portion 18' of the bobbin 16'.

The movable mass assembly 40 is centered in a stiff outer shell 22' by a plurality of suspension members constituted by O-rings 30'. The O-rings 30' are disposed in grooves 28' formed at top and bottom portions of the bobbin 16'. The O-rings 30' suspend the moving mass assembly 40 inside the stiff outer shell 22' and provide a support that is stiff radially, yet compliant axially. Furthermore, the O-rings provide sealing protection against external factors, such as weather, and external shocks and loads. Within approximately 0.002 inches of reaction mass translation, the effect of the O-rings on the system dynamics is negligible.

The Terfenol rod 12' is placed under axially compressive stress by a simple mechanical preloading or prestress mechanism including a wave spring 32'. Preloading increases strain in the Terfenol rod. The spring 32' also provides a return spring for the reaction mass when it has reached its maximum stroke. In this embodiment, a top portion of the hollow cylindrical portion 18' of the bobbin 16' has an interior thread that receives a positioning screw 42. With the reaction mass assembly 40 suspended in the shell or housing 22', the positioning screw 42 is used to set the height or axial position of the mass assembly 40 in the shell 22'. As a portion of the bobbin 16', comprising part of the mass assembly 40, pushes against the preload spring 32', adjustment of the positioning screw in effect adjusts the amount of spring force exerted against the mass assembly 40, i.e. setting the baseline preload as a function of the position of the mass 40 as determined by the screw 42.

In this illustrative embodiment, heat generated in the coil is removed through conduction and convection through air to the baseplate and shell. In higher power application(s), the sealed shell 32 can be filled with Fluorinert, a dielectric cooling fluid produced by 3M. Such two-phase cooling allows extremely high power levels and high temperature operating environments.

Magnetostrictive materials, such as Terfenol, are well suited for application in the reaction mass actuator(s) described hereinbefore, due to their inherent high force and bandwidth. The illustrative Terfenol based reaction-mass actuators are 2.125 inches long and 1.5 inches in diameter. They produces more than ±30 lbf at 700 Hz and weighs 0.6 lbm. However, it should be appreciated that a family of reaction mass actuators could be developed based on the design illustrated herein. For example, reduction of the actuator force given the same Terfenol rod length would allow the reduction of the reaction mass weight by half, assuming the Terfenol rod cross-sectional area were reduced by half to maintain the same resonant frequency.

Further, it should be appreciated that the illustrative design described hereinbefore allows for the variation of bias field in order to reduce power consumption when full force output is not required. Moderately higher actuator power consumption occurs at full force output due to increased coil heating. Weight reduction requirements, however, mitigate against the use of permanent magnet biasing to reduce power consumption, unless the permanent magnets are packaged onto the moving assembly. The weight penalty for including permanent magnet biasing can be limited, for example, by including cylindrical magnets mounted on the moving bobbin and surrounding the windings. The operation of such an actuator is functionally identical to that of the actuator described hereinbefore.

Thus, it should be appreciated that although a single coil is described in the actuator according to the invention as both providing the moving mass and effecting the electromagnetic force for actuation of the Terfenol rod, while an electronic implementation effects both a bias current and an actuation signal delivered through the single coil, the bias field or some portion thereof can be alternatively provided by implementing a permanent magnet biasing scheme while maintaining the actuator signal coil as a substantial portion of the moving mass. That is, permanent magnet biasing can be implemented in conjunction with or as an alternative to DC current applied to the coil to produce the needed DC field for biasing the terfenol rod.

Although a simple preload mechanism in the form of a wave spring is implemented in the illustrative embodiments described herein, it should be appreciated that other preload mechanisms could be implemented, such as mechanical biasing means including various types of springs, elastomers or compressive materials, adjustable threaded members, flexures or the like.

Although the reaction mass described herein is "suspended" in the outer shell by means of two suspension grooves formed in the mass and dimensioned to receive respective elastomeric suspension members in the form of O-rings, it should be appreciated that an alternative number of suspension grooves and elastomeric suspension members, i.e greater than two, can be implemented, and further, other suspension members or support a mechanisms can be incorporated in the reaction mass actuator according to the invention to effect the substantially symmetrical design, including various other bearing surfaces, alternative geometrically dimensioned elastomeric mounts, flexures or the like.

While the reaction-mass actuator described herein is discussed as a high force-density actuator for active noise and vibration cancellation in helicopter gear boxes, it should be appreciated that the reaction mass actuator according to the invention can be alternatively implemented in other applications, including applications where a high force-to-mass ratio is critical, such as other aerospace or land-based applications including applications for removal of engine noise, gear whine, vibration from rotating machines, or the like.

Although the invention has been shown and described with respect to exemplary embodiments thereof, various other changes, omissions and additions in the form and detail thereof may be made therein without departing from the spirit and scope of the invention.

What is claimed is:

1. A reaction mass actuator comprising:
   a magnetostrictive member;
   an electromagnetic coil having a hollow interior portion configured to receive said magnetostrictive member therein;
   a reaction mass assembly including a reaction mass, said electromagnetic coil and said magnetostrictive member, wherein said electromagnetic coil forms a portion of said reaction mass and is actuated in accordance with a mass excitation signal;
   a rigid outer shell configured to receive said reaction mass assembly; and
   an elastomeric mounting system configured to engage said reaction mass assembly and an interior surface of said rigid outer shell to suspend said reaction mass in said rigid outer shell.

2. The reaction mass actuator of claim 1 wherein said electromagnetic coil and said magnetostrictive member form a stationary drive assembly disposed interior to said reaction mass, and which effects actuation of said reaction mass in accordance with a mass excitation signal.

3. The reaction mass actuator of claim 1 wherein said electromagnetic coil is formed on a bobbin configured to provide said hollow interior portion.

4. The reaction mass actuator of claim 1 wherein said elastomeric mounting system comprises a plurality of O-rings engaging said reaction mass assembly and an interior surface of said rigid outer shell to suspend said reaction mass in said rigid outer shell.

5. The reaction mass actuator of claim 3 wherein said bobbin includes a plurality of grooves and wherein said elastomeric mounting system comprises a plurality of O-rings disposed in said grooves engaging an interior surface of said rigid outer shell to suspend said reaction mass in said rigid outer shell.

6. The reaction mass actuator of claim 1 wherein said reaction mass includes a plurality of grooves and wherein said elastomeric mounting system comprises a plurality of O-rings disposed in said grooves engaging an interior surface of said rigid outer shell to suspend said reaction mass in said rigid outer shell.

7. The reaction mass actuator of claim 1 further comprising a preload mechanism exerting a force on said reaction mass assembly to maintain a selected compressive force on said magnetostrictive member.

8. The reaction mass actuator of claim 1 wherein said magnetostrictive member comprises a Terfenol rod.

9. The reaction mass actuator of claim 7 wherein said preload mechanism comprises a wave spring exerting a force on said reaction mass assembly, and a positioning screw configured to adjust position of said reaction mass in said rigid outer shell to maintain a selected compressive force on said magnetostrictive member.

10. A reaction mass actuator for imparting forces on a mounting surface comprising:
    a magnetostrictive member;
    an electromagnetic coil having a hollow interior portion configured to receive said magnetostrictive member therein;
    a reaction mass assembly including said electromagnetic coil and said magnetostrictive member, said electromagnetic coil being actuatable linearly with respect to said mounting surface;
    a rigid outer shell configured to receive said reaction mass assembly and to retain said magnetostrictive member fixed therein; and
    an elastomeric mounting system configured to engage said reaction mass assembly and an interior surface of said rigid outer shell to suspend said reaction mass in said rigid outer shell.

11. The reaction mass actuator of claim 10 wherein said electromagnetic coil is formed on a bobbin configured to provide said hollow interior portion.

12. The reaction mass actuator of claim 10 wherein said elastomeric mounting system comprises a plurality of O-rings engaging said reaction mass assembly and an interior surface of said rigid outer shell to suspend said reaction mass in said rigid outer shell.

13. The reaction mass actuator of claim 11 wherein said bobbin includes a plurality of grooves and wherein said elastomeric mounting system comprises a plurality of O-rings disposed in said grooves engaging an interior surface of said rigid outer shell to suspend said reaction mass in said rigid outer shell.

14. The reaction mass actuator of claim 10 wherein said reaction mass includes a plurality of grooves and wherein said elastomeric mounting system comprises a plurality of O-rings disposed in said grooves engaging an interior surface of said rigid outer shell to suspend said reaction mass in said rigid outer shell.

15. The reaction mass actuator of claim 10 further comprising a preload mechanism exerting a force on said reaction mass assembly to maintain a selected compressive force on said magnetostrictive member.

16. The reaction mass actuator of claim 10 wherein said magnetostrictive member comprises a Terfenol rod.

17. The reaction mass actuator of claim 15 wherein said preload mechanism comprises a wave spring exerting a force on said reaction mass assembly, and a positioning screw configured to adjust position of said reaction mass in said rigid outer shell to maintain a selected compressive force on said magnetostrictive member.

18. A reaction mass actuator comprising:

a magnetostrictive member;

an electromagnetic coil having a hollow interior portion configured to receive said magnetostrictive member therein;

a reaction mass assembly including a reaction mass, said electromagnetic coil and said magnetostrictive member;

a rigid outer shell configured to receive said reaction mass assembly;

a preload mechanism exerting a force on said reaction mass assembly to maintain a selected compressive force on said magnetostrictive member, said preload mechanism comprising a wave spring exerting a force on said reaction mass assembly, and a positioning screw configured to adjust position of said reaction mass in said rigid outer shell to maintain a selected compressive force on said magnetostrictive member; and an elastomeric mounting system configured to engage said reaction mass assembly and an interior surface of said rigid outer shell to suspend said reaction mass in said rigid outer shell.

19. The reaction mass actuator of claim 18 wherein said reaction mass includes a plurality of grooves and wherein said elastomeric mounting system comprises a plurality of O-rings disposed in said grooves engaging an interior surface of said rigid outer shell to suspend said reaction mass in said rigid outer shell.

* * * * *